(12) United States Patent
Hugers et al.

(10) Patent No.: US 10,520,824 B2
(45) Date of Patent: Dec. 31, 2019

(54) WAVELENGTH COMBINING OF MULTIPLE SOURCE

(71) Applicants: ASML Netherlands B.V., Veldhoven (NL); ASML Holding N.V., Veldhoven (NL)

(72) Inventors: Ronald Franciscus Herman Hugers, Veldhoven (NL); Parag Vinayak Kelkar, Wilton, CT (US); Paulus Antonius Andreas Teunissen, Veldhoven (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/078,699

(22) PCT Filed: Feb. 7, 2017

(86) PCT No.: PCT/EP2017/052575
§ 371 (c)(1),
(2) Date: Aug. 22, 2018

(87) PCT Pub. No.: WO2017/148656
PCT Pub. Date: Sep. 8, 2017

(65) Prior Publication Data
US 2019/0049864 A1 Feb. 14, 2019

Related U.S. Application Data

(60) Provisional application No. 62/302,973, filed on Mar. 3, 2016.

(51) Int. Cl.
*G03B 27/72* (2006.01)
*G03F 7/20* (2006.01)
(Continued)

(52) U.S. Cl.
CPC ........ *G03F 7/7005* (2013.01); *G01B 11/0608* (2013.01); *G02B 27/1006* (2013.01);
(Continued)

(58) Field of Classification Search
CPC ................ G02B 27/10; G02B 27/1006; G02B 27/1013; G02B 27/106; G02B 27/1066;
(Continued)

(56) References Cited

U.S. PATENT DOCUMENTS 4,823,357 A    4/1989 Casey
5,502,311 A *  3/1996 Imai ..................... G03F 7/70858
                                                      250/548

(Continued)

FOREIGN PATENT DOCUMENTS

EP   2 128 701 A1   12/2009
JP   2001-042431 A   2/2001
(Continued)

OTHER PUBLICATIONS

International Search Report and Written Opinion of the International Searching Authority directed to related International Patent Application No. PCT/EP2017/052575, dated May 22, 2017; 11 pages.

*Primary Examiner* — Christina A Riddle
(74) *Attorney, Agent, or Firm* — Sterne, Kessler, Goldstein & Fox P.L.L.C.

(57) ABSTRACT

A light combiner (500) for use in a metrology tool includes a plurality of light sources (LED 1, LED 2, LED 3, LED 4, LED 5), a first filter (502), and a second filter (504). The first filter is designed to substantially reflect light generated from a first source of the plurality of light sources, and to substantially transmit light generated from a second source of the plurality of light sources. The second filter is designed to substantially reflect light generated from the first source (Continued)

and the second source of the plurality of light sources, and to substantially transmit light generated from a third source of the plurality of light sources. An angle of incidence of the light generated from the first source on a surface of the first filter is less than 30 degrees.

20 Claims, 9 Drawing Sheets

(51) Int. Cl.
G02B 27/14 (2006.01)
G03F 9/00 (2006.01)
G01B 11/06 (2006.01)
G02B 27/10 (2006.01)

(52) U.S. Cl.
CPC ......... *G02B 27/142* (2013.01); *G02B 27/145* (2013.01); *G03F 7/70616* (2013.01); *G03F 7/70775* (2013.01); *G03F 9/7034* (2013.01); *G01B 2210/56* (2013.01)

(58) Field of Classification Search
CPC .... G02B 27/14; G02B 27/141; G02B 27/142; G02B 27/145; G01B 11/0608; G01B 2210/56; G03F 9/7034; G03F 9/7003; G03F 9/7019; G03F 9/7023; G03F 9/7026; G03F 9/7065; G03F 9/7088; G03F 9/7092; G03F 7/7005; G03F 7/70008; G03F 7/70775; G03F 7/70625; G03F 7/70633; G03F 7/70641; G03F 7/70666; G03F 7/70675; G03F 7/70683; G03F 7/7085; G03F 7/7095; G03F 7/70991

USPC ...... 355/52, 53, 55, 67–71, 72–77; 362/209, 362/211, 214, 224, 230, 231, 235, 249.02; 359/618, 629, 633, 634, 839, 850, 857, 359/861, 884, 577, 580, 584, 585–590, 359/359, 360, 361; 356/4.01, 4.03, 4.05, 356/614, 615, 616, 624, 399–401
See application file for complete search history.

(56) References Cited

U.S. PATENT DOCUMENTS

| | | |
|---|---|---|
| 6,005,718 A | 12/1999 | Park et al. |
| 6,101,037 A | 8/2000 | Park et al. |
| 7,212,344 B2 | 5/2007 | Keuper et al. |
| 2002/0093732 A1* | 7/2002 | Knapp ............... G01J 1/429 359/361 |
| 2004/0150828 A1 | 8/2004 | Hendrix et al. |
| 2008/0234670 A1 | 9/2008 | Rogers |
| 2010/0283978 A1* | 11/2010 | Hawryluk ........... G03F 7/7005 355/18 |
| 2014/0139929 A1* | 5/2014 | Li ..................... G02B 27/141 359/634 |

FOREIGN PATENT DOCUMENTS

| | | |
|---|---|---|
| JP | 2005-242364 A | 9/2005 |
| JP | 2012-047872 A | 3/2012 |
| JP | 2012-049226 A | 3/2012 |
| JP | 2014-207300 A | 10/2014 |
| WO | WO 2001/037024 A2 | 5/2001 |

* cited by examiner

WAVELENGTH COMBINING OF MULTIPLE SOURCE

CROSS-REFERENCE TO RELATED APPLICATIONS

This application claims priority of U.S. application 62/302,973, which was filed on Mar. 3, 2016, and which is incorporated herein in its entirety by reference.

FIELD

The present disclosure relates to light sources used in metrology systems that may be associated, for example, with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use a metrology system for detecting positions of the alignment marks (e.g., X and Y position) and for aligning the substrate using the alignment marks to ensure accurate exposure from a mask. The metrology system may be used to determine a height of a wafer surface in the Z direction.

Alignment systems typically have their own illumination system. Illumination systems used for determining alignment and/or height typically provide a range of wavelengths. Ultraviolet light provides better performance in these illumination systems when compared to visible light due to its smaller wavelength, but combining multiple ultraviolet (UV) light sources can be challenging.

SUMMARY

Accordingly, there is a need for improving the design of alignment system illumination systems to more efficiently provide a range of UV wavelengths.

According to an embodiment, a light combiner includes a plurality of light sources, a first filter, and a second filter. The first filter is designed to substantially reflect light generated from a first source of the plurality of light sources, and to substantially transmit light generated from a second source of the plurality of light sources. The second filter is designed to substantially reflect light generated from the first source and the second source of the plurality of light sources, and to substantially transmit light generated from a third source of the plurality of light sources. An angle of incidence of the light generated from the first source on a surface of the first filter is less than 30 degrees.

In another embodiment, a metrology system includes a radiation source that generates light, a projection grating, a detection grating, and a detector. The projection grating receives the light and projects an image towards a substrate. The detection grating receives the image reflected off a surface of the substrate. The detector receives the image from the detection grating and measures a height of the surface of the substrate based on the received image. The radiation source includes a plurality of light sources, a first filter, and a second filter. The first filter is designed to substantially reflect light generated from a first source of the plurality of light sources, and to substantially transmit light generated from a second source of the plurality of light sources. The second filter is designed to substantially reflect light generated from the first source and the second source of the plurality of light sources, and to substantially transmit light generated from a third source of the plurality of light sources. An angle of incidence of the light generated from the first source on a surface of the first filter is less than 30 degrees.

In yet another embodiment, a lithographic apparatus includes an illumination system designed to illuminate a pattern of a patterning device, a projection system that projects an image of the pattern onto a target portion of a substrate, and a metrology system that determines a height of a surface of the substrate. The metrology system has a radiation source that includes a plurality of light sources, a first filter, and a second filter. The first filter is designed to substantially reflect light generated from a first source of the plurality of light sources, and to substantially transmit light generated from a second source of the plurality of light sources. The second filter is designed to substantially reflect light generated from the first source and the second source of the plurality of light sources, and to substantially transmit light generated from a third source of the plurality of light sources. An angle of incidence of the light generated from the first source on a surface of the first filter is less than 30 degrees.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
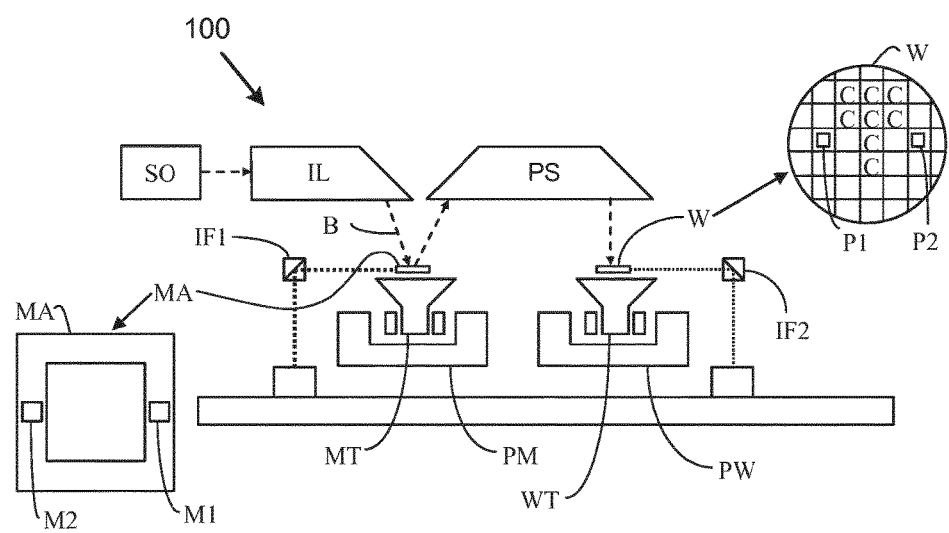
FIG. 1A is a schematic illustration of a reflective lithographic apparatus according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
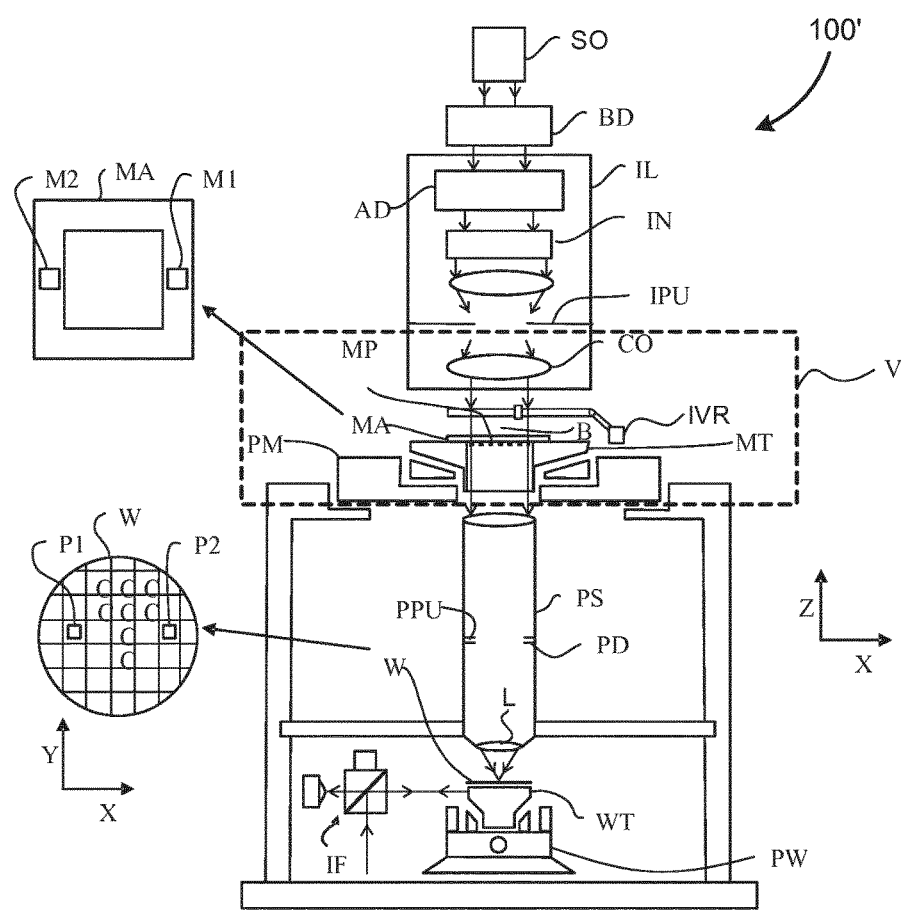
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
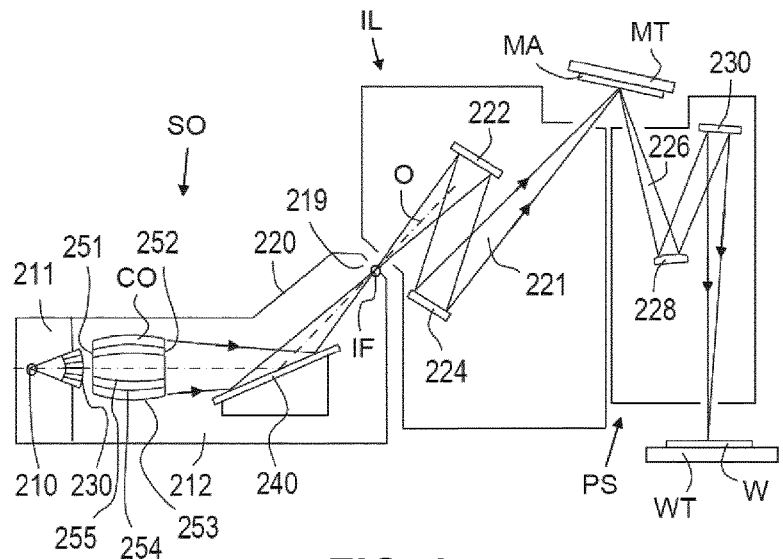
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
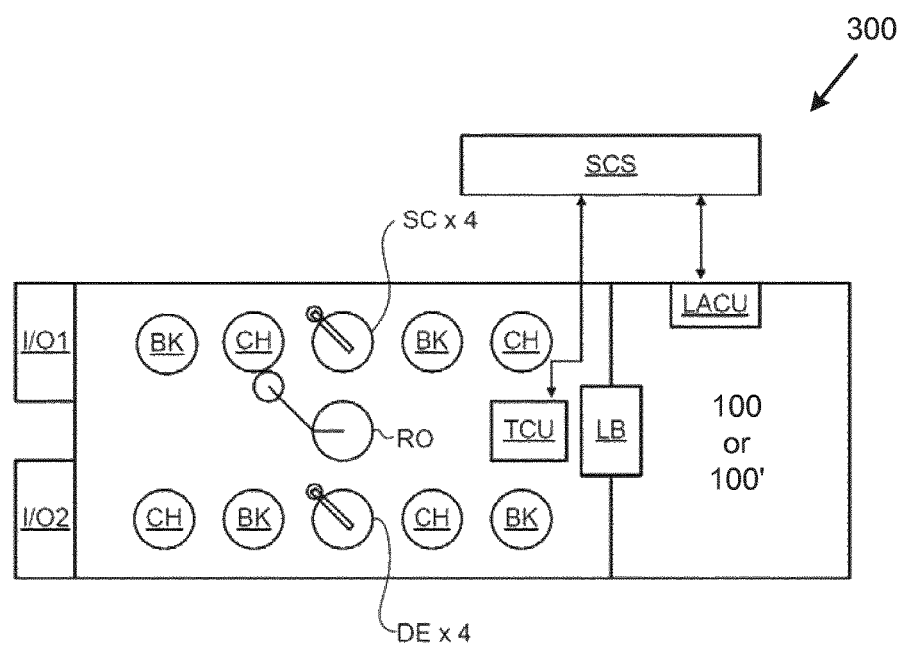
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Metrology System

Figure 4:
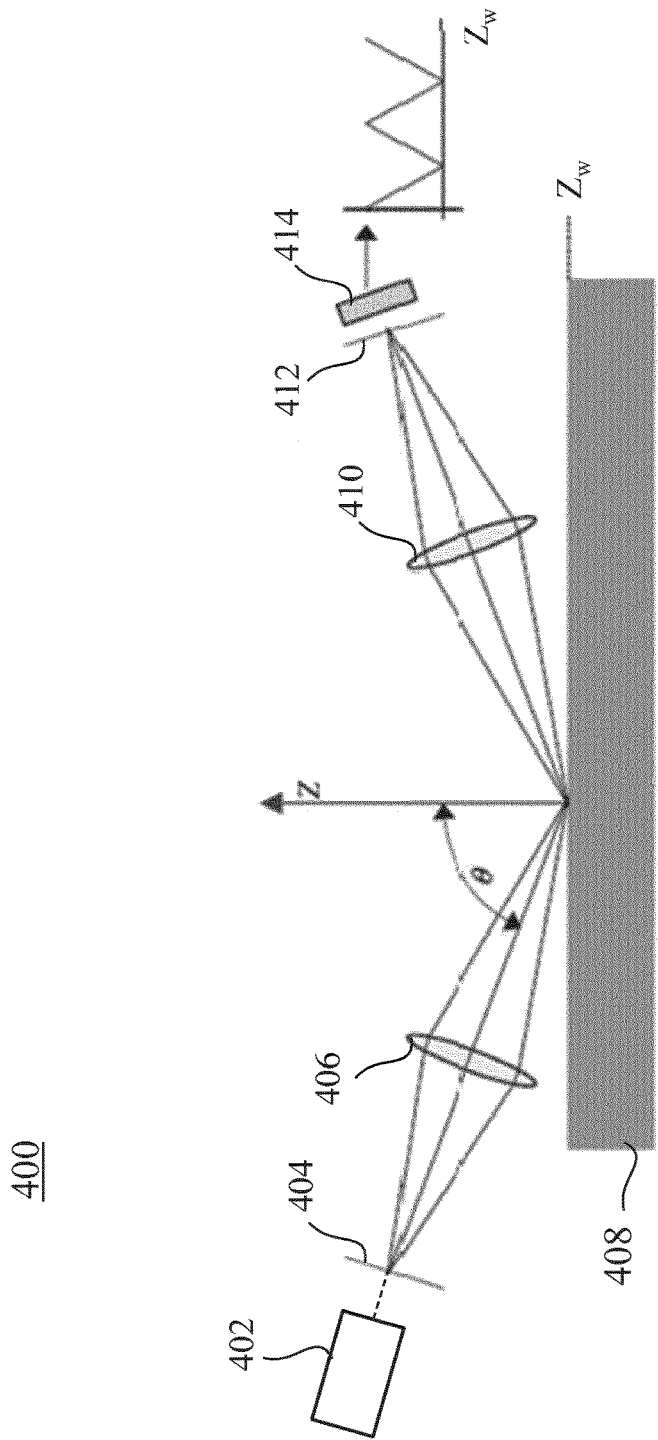
FIG. 4 is a schematic illustration of a metrology system, according to an embodiment.

FIG. 4 illustrates a schematic of a metrology system 400 that can be implemented as a part of lithographic apparatus 100 or 100', according to an embodiment. In an example of this embodiment, metrology system 400 may be configured to measure height and height variations on a surface of substrate W. In some other embodiments, metrology system 400 may be configured to detect positions of alignment marks on the substrate and to align the substrate with respect to the patterning device or other components of lithography apparatus 100 or 100' using the detected positions of the alignment marks.

According to an embodiment, metrology system 400 may include a radiation source 402, a projection grating 404, a detection grating 412, and a detector 414, according to an embodiment. Radiation source 402 may be configured to provide an electromagnetic narrow band radiation beam having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. In another example, radiation source 402 generates light within the ultraviolet (UV) spectrum of wavelengths between about 225 nm and 400 nm. Radiation source 402 may be further configured to provide one or more passbands having substantially constant center wavelength (CWL) values over a long period of time (e.g., over a lifetime of radiation source 402). Such configuration of radiation source 402 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

Projection grating 404 may be configured to receive the beam (or beams) of radiation generated from radiation source 402, and provide a projected image onto a surface of a substrate 408. Imaging optics 406 may be included between projection grating 404 and substrate 408, and may include one or more lenses, mirrors, gratings, etc. In one embodiment, imaging optics 406 is configured to focus the image projected from projection grating 404 onto the surface of substrate 408.

In an embodiment, projection grating 404 provides an image on the surface of substrate 408 at an angle θ relative to the surface normal. The image is reflected by the substrate surface and is re-imaged on detection grating 412. Detection grating 412 may be identical to projection grating 404. Imaging optics 410 may be included between substrate 408 and substrate detection grating 412, and may include one or more lenses, mirrors, gratings, etc. In one embodiment, imaging optics 408 is configured to focus the image reflected from the surface of substrate 408 onto detection grating 412. Due to the oblique incidence, a height variation ($Z_w$) in the surface of substrate 408 will shift the image projected by projection grating 404 when it is received by detection grating 412 over a distance (s) as given by the following equation (1):

$$s = 2Z_w \sin(\theta) \quad (1)$$

According to an embodiment, the shifted image of projection grating 404 is partially transmitted by detection grating 412 and the transmitted intensity, which is a periodic function of the image shift. This shifted image is received and measured by detector 414. Detector 414 may include a photodiode or photodiode array. Other examples of detector 414 include a CCD array. In one embodiment, detector 414 may be designed to measure wafer height variations as low as 1 nm based on the received image.

Example Alignment System Radiation Sources

Radiation source 412 may be configured to output light in wavelengths ranging from UV to NIR (near infrared) spectrum. In some embodiments, UV wavelengths provide better metrology sensor performance (accuracy). The UV light may have a wide bandwidth between about 225 nm and 400 nm. A tunable infrared laser source may be provided, along with one or more frequency doubling components, or a laser excited plasma source, to provide the range of UV wavelengths. However, such a configuration is inefficient and consumes a large amount of power.

According to an embodiment, a radiation source is presented that uses a plurality of light sources at different center wavelengths to generate light having a bandwidth that spans between 100 and 200 nm in the UV spectrum. A single light source with a large bandwidth may also be used. The plurality of light sources may comprise UV light-emitting diodes (LED) having a full-width half-maximum (FWHM) of 10 nm around a center wavelength. For example, five UV LEDs having center wavelengths of 265 nm, 280 nm, 300 nm, 320 nm, and 340 nm may have their output combined to emit broadband light having wavelengths between about 250 nm and 355 nm. A light combining system using a series of beam splitters may be used to combine the output of each LED in an efficient manner. Other optical elements such as diffraction gratings and dispersion prisms may also be used when combining the output of each LED.

Figure 5:
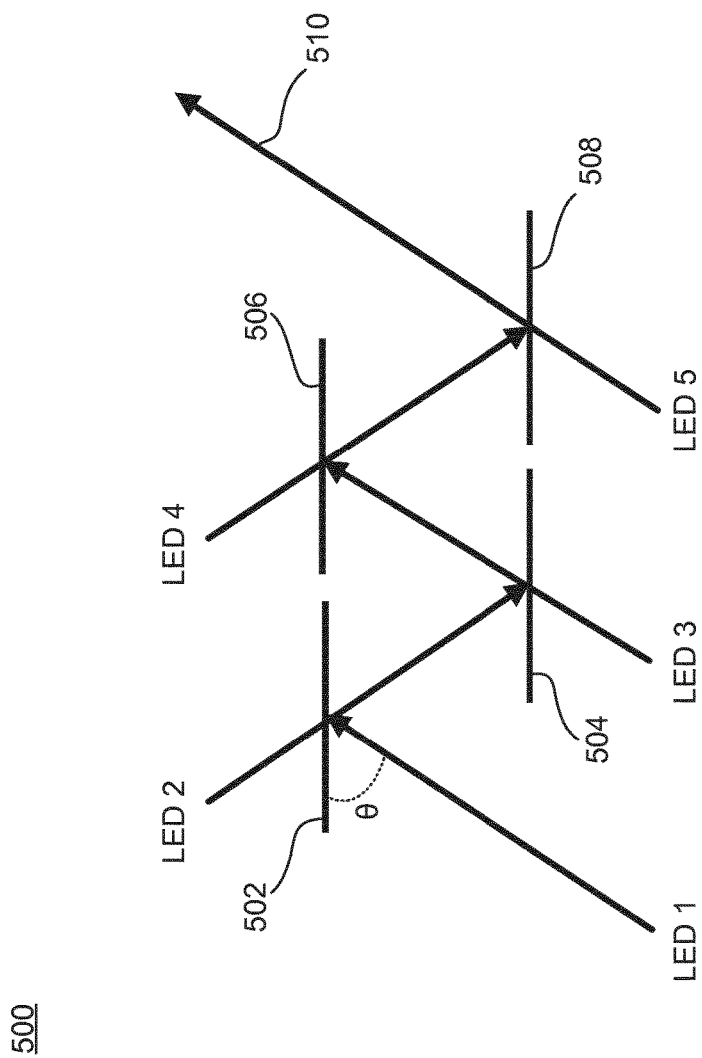
FIG. 5 is a schematic illustration of a light combiner, according to an embodiment.

FIG. 5 illustrates an example of a light combiner 500 that may be used to combine the output of a plurality of light sources, according to an embodiment. Light combiner 500 may be one of several components within radiation source 402. Light combiner 500 includes a series of filters (e.g., 502, 504, 506, and 508). The filters each act like beam splitters that reflect only certain wavelengths, while allowing other wavelengths to pass through.

In light combiner 500, five LED sources (LED 1, LED 2, LED 3, LED 4, and LED 5) are combined; however, any number of light sources may be combined, and sources other than LEDs may be used as well. In an embodiment, each LED source emits light in the UV spectrum (e.g., between about 225 nm and about 400 nm.) Each LED source may have a different center wavelength. In one example, LED 1 has a center wavelength between about 250 nm and about 280 nm, LED 2 has a center wavelength between about 265 nm and about 295 nm, LED 3 has a center wavelength between about 285 nm and about 315 nm, LED 4 has a center wavelength between about 305 nm and about 335 nm, and LED 5 has a center wavelength between about 325 nm and about 355 nm. In one embodiment, the center wavelength for a given LED is at least 10 nm higher than the center wavelength for a preceding LED (e.g., LED 3 has a center wavelength at least 10 nm higher than LED 2.)

Filter 502 may be designed with a surface that substantially reflects the light generated by LED 1 while substantially transmitting the light generated by LED 2. Filter 502 may be designed to reflect over 50%, over 60%, over 70%, over 80%, or over 90% of the incident light generated by LED1, while transmitting over 50%, over 60%, over 70%, over 80%, or over 90% of the light generated by LED2.

Following with the illustrated example of light combiner 500, filter 504 is designed with a surface that substantially reflects light generated by LED 1 and LED 2 while substantially transmitting the light generated by LED 3. Filter 504 may be designed to reflect over 50%, over 60%, over 70%, over 80%, or over 90% of the incident light generated by LED1 and LED2, while transmitting over 50%, over 60%, over 70%, over 80%, or over 90% of the light generated by LED3.

Filter 506 is designed with a surface that substantially reflects light generated by LED 1, LED 2, and LED 3 while substantially transmitting the light generated by LED 4. Filter 506 may be designed to reflect over 50%, over 60%, over 70%, over 80%, or over 90% of the incident light generated by LED1, LED2, and LED3 while transmitting over 50%, over 60%, over 70%, over 80%, or over 90% of the light generated by LED4.

Filter 508 is designed with a surface that substantially reflects light generated by LED 1, LED 2, LED 3, and LED 4 while substantially transmitting the light generated by LED 5. Filter 508 may be designed to reflect over 50%, over 60%, over 70%, over 80%, or over 90% of the incident light generated by LED1, LED2, LED3, and LED4 while transmitting over 50%, over 60%, over 70%, over 80%, or over 90% of the light generated by LED5.

A final light output 510 includes contributions from each of LEDs 1 through 5. Final light output 510 may be received by any form of lightguide in order to be directed towards a substrate. In another example, final light output 510 is received by free-space optical components such as lens and/or mirrors to be directed towards a substrate.

The placement of each of filters 502-508 is not limited to the illustration in FIG. 5. Additionally, there may be other optical components placed before, after, or between any of filters 502-508 for collimating, focusing, and/or directing the light without deviating from the scope or spirit of the embodiments described herein. Additional filters may be added to light combiner 500 without the need to adjust or replace the existing filters.

Light is incident upon a surface of a given filter at an incidence angle θ. According to an embodiment, incidence angle θ is less than 45 degrees or less than 30 degrees. Incidence angle θ may be between 10 degrees and 25 degrees. Incidence angle θ may be around 15 degrees. Using a smaller incidence angle may help to reduce or eliminate polarization splitting from occurring, and thus maximize the amount of light that is being reflected. Although incidence angle θ is only illustrated for filter 502 in FIG. 5, the incidence angle of the light being received at each filter 502, 504, 506, and 508 may be between 10 degrees and 25 degrees. In one embodiment, each of filters 502, 504, 506, and 508 are arranged such that the incidence angle is the same for each filter.

Figure 6:
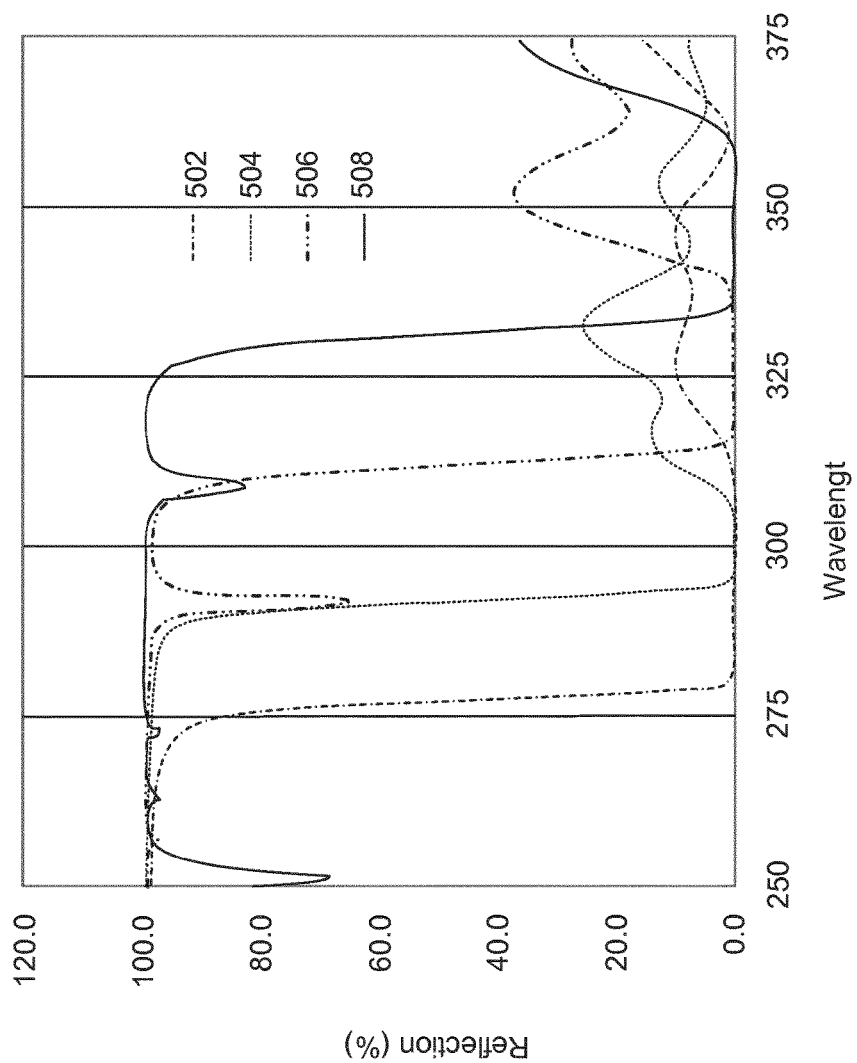
FIG. 6 is a graph of simulated data showing reflection vs. wavelength for different filters, according to an embodiment.

FIG. 6 provides the simulated output of reflection percentage vs. incident light wavelength for each filter design, according to an embodiment. As can be seen from FIG. 6, filter 502 is designed to have a high reflection for wavelengths less than about 275 nm, in one example. Thus, in this example where LED 1 is a UV source with a center wavelength around 265 nm, the majority of the light generated from LED 1 is reflected by filter 502. Filter 502 becomes almost entirely transmissive for wavelengths higher than about 280 nm, in this example. Thus, when LED 2 is a UV source with a center wavelength around 280 nm, the majority of light generated from LED 2 will transmit through filter 502.

Filter 504 is designed to have a high reflection for wavelengths less than about 290 nm, in one example. Thus, in this example where LED 1 is a UV source with a center wavelength around 265 nm, and LED 2 is a UV source with a center wavelength around 280 nm, the majority of the light generated from LED 1 and LED 2 is reflected by filter 504. Filter 504 becomes almost entirely transmissive for wavelengths higher than about 295 nm, in this example. Thus, when LED 3 is a UV source with a center wavelength around 300 nm, the majority of light generated from LED 3 will transmit through filter 504.

Filter 506 is designed to have a high reflection for wavelengths less than about 310 nm, in one example. Thus, in this example where LED 1 is a UV source with a center wavelength around 265 nm, LED 2 is a UV source with a center wavelength around 280 nm, and LED 3 is a UV source with a center wavelength around 300 nm, the majority of the light generated from LED 1, LED 2, and LED 3 is reflected by filter 506. Filter 506 becomes almost entirely transmissive for wavelengths higher than about 315 nm, in this example. Thus, when LED 4 is a UV source with a center wavelength around 320 nm, the majority of light generated from LED 4 will transmit through filter 506.

Filter 508 is designed to have a high reflection for wavelengths less than about 325 nm, in one example. Thus, in this example where LED 1 is a UV source with a center wavelength around 265 nm, LED 2 is a UV source with a center wavelength around 280 nm, LED 3 is a UV source with a center wavelength around 300 nm, and LED 4 is a UV source with a center wavelength around 320 nm, the majority of the light generated from LED 1, LED 2, LED 3, and LED 4 is reflected by filter 508. Filter 508 becomes almost entirely transmissive for wavelengths higher than about 335 nm, in this example. Thus, when LED 5 is a UV source with a center wavelength around 340 nm, the majority of light generated from LED 5 will transmit through filter 508. The reflectivity properties of each filter may be tuned based on a thin-film layer structure design on the filter's surface, as is explained in more detail in FIG. 8.

Note that in the embodiment described with reference to FIG. 5, LED 1 through LED 5 had increasing wavelengths. However, the order of the LEDs and corresponding filters may be rearranged such that the wavelengths are combined in any order.

Figure 7:
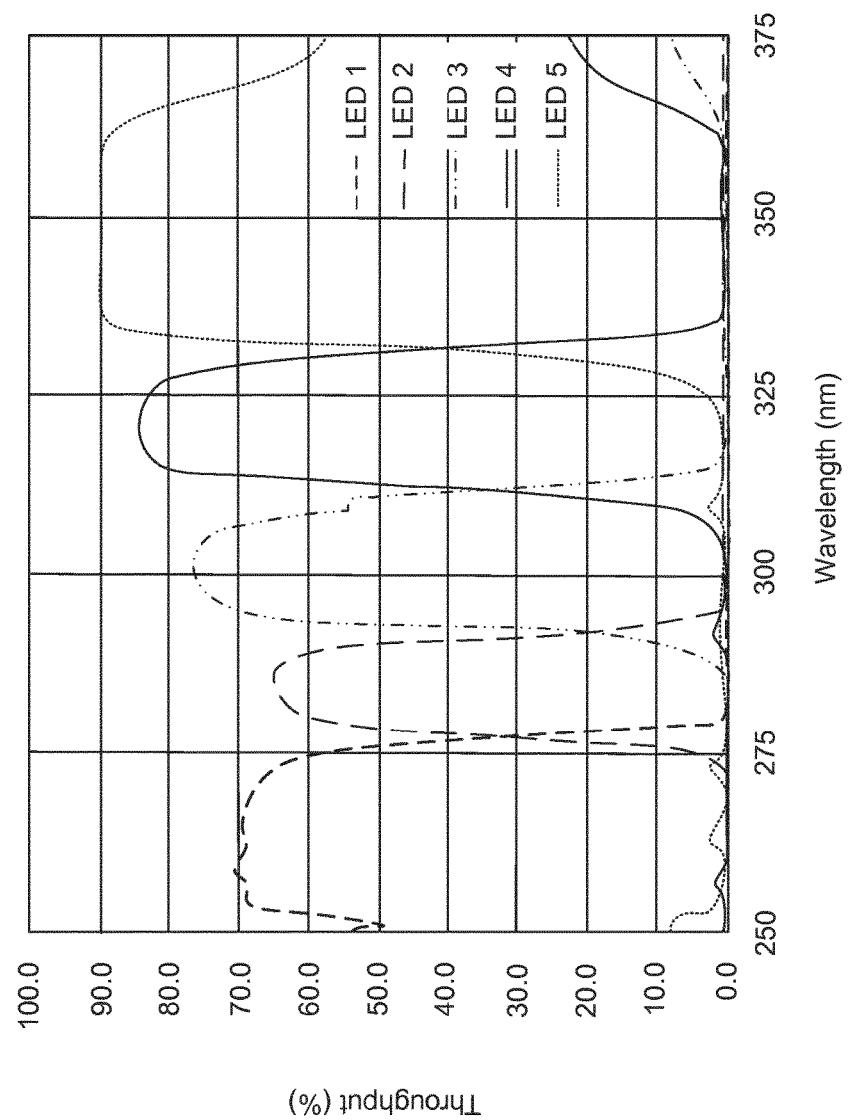
FIG. 7 is a graph of simulated data showing optical throughout vs. wavelength of the light combiner, according to an embodiment.

FIG. 7 provides the simulated output of the final light throughout of light combiner 500 based on wavelength, according to an embodiment. As can be seen from the simulated data, final light output 510 includes intensity peaks at wavelengths that correspond to the center wavelengths of each LED being combined. In this example, the center wavelengths of LEDs 1 . . . 5 are 265 nm, 280 nm, 300 nm, 320 nm, and 340 nm, respectively.

Figure 8:
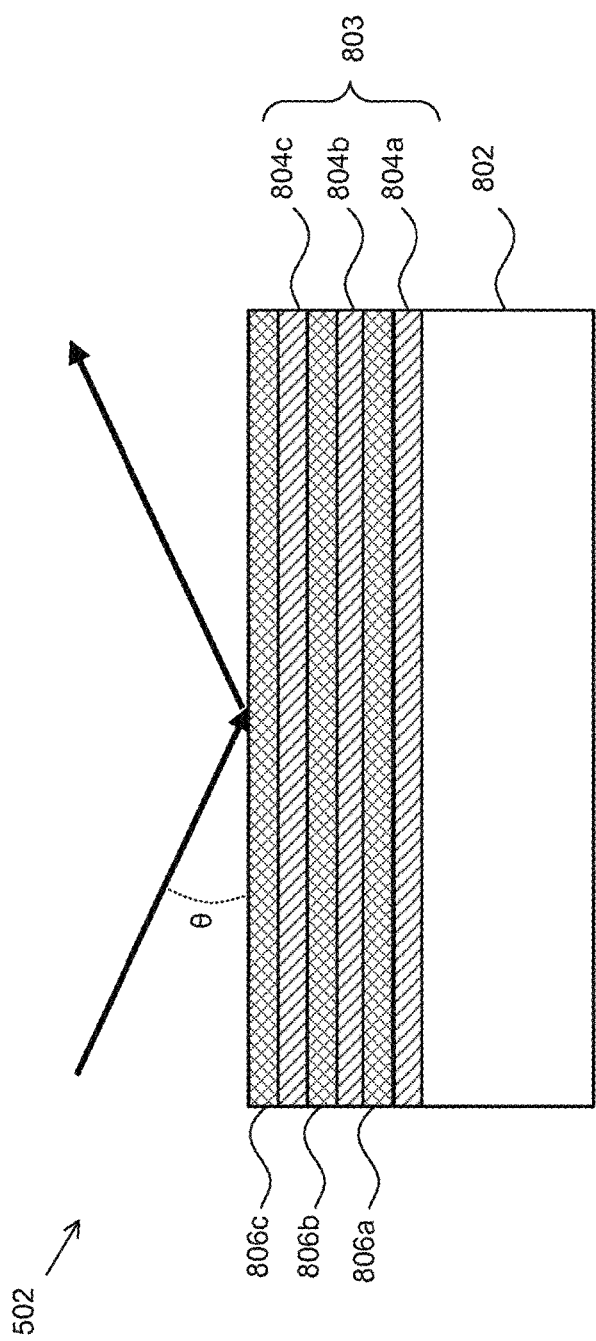
FIG. 8 is a schematic of a filter, according to an embodiment.

FIG. 8 illustrates an example of one layer structure design used with filter 502, according to an embodiment. Although this example is for filter 502, it should be understood that this discussion applies to any of filters 504, 506, or 508.

Filter 502 includes a substrate 802 that may be any material having a low absorption for the wavelengths being used with filter 502. Example substrate materials include fused silica, calcium fluoride, magnesium fluoride, barium fluoride, and sapphire.

Substrate 802 includes a plurality of thin-films in a stacked structure 803 that provide filter 502 with its reflectance properties, according to an embodiment. Any number of thin film layers may be used within stacked structure 803. According to an embodiment, each thin film layer has a thickness of less than 100 nm, or less than 75 nm. In one example, each thin film layer has a thickness between about 5 nm and about 65 nm. Each thin film layer in stacked structure 803 may have the same thickness, or may each have different thicknesses. According to an embodiment, the reflectance properties of filter 502 is determined in part by the number of thin film layers used, each of their individual thicknesses, and the materials used for each thin film layer.

Thin films 804a-c may represent the same material and alternate with thin films 806a-c, which may also represent the same material. Thin films 804a-c may be silicon dioxide while thin films 806a-c may be hafnium oxide. Other example materials that may be used for any of thin films 804a-c and 806a-c include magnesium fluoride, lanthanum fluoride, and aluminum oxide. In an embodiment, each thin film 804a-804c represents a different material. Similarly, each thin film 806a-806c may represent a different material. In another embodiment, stacked structure 803 includes a subgroup of three thin film layers that repeat, such that thin film 804a and thin film 806b represent the same material, thin film 806a and 804c represent the same material, and thin film 804b and 806c represent the same material.

The bold arrows represent the relative path of an incident and reflected beam of radiation off of stacked structure 803. Incident angle θ is shown and is between 10 degrees and 25 degrees, according to an embodiment. The number of thin films, thickness of each thin film, and material used for each thin film may determine what wavelengths of light are substantially reflected by filter 502.

Figure 9:
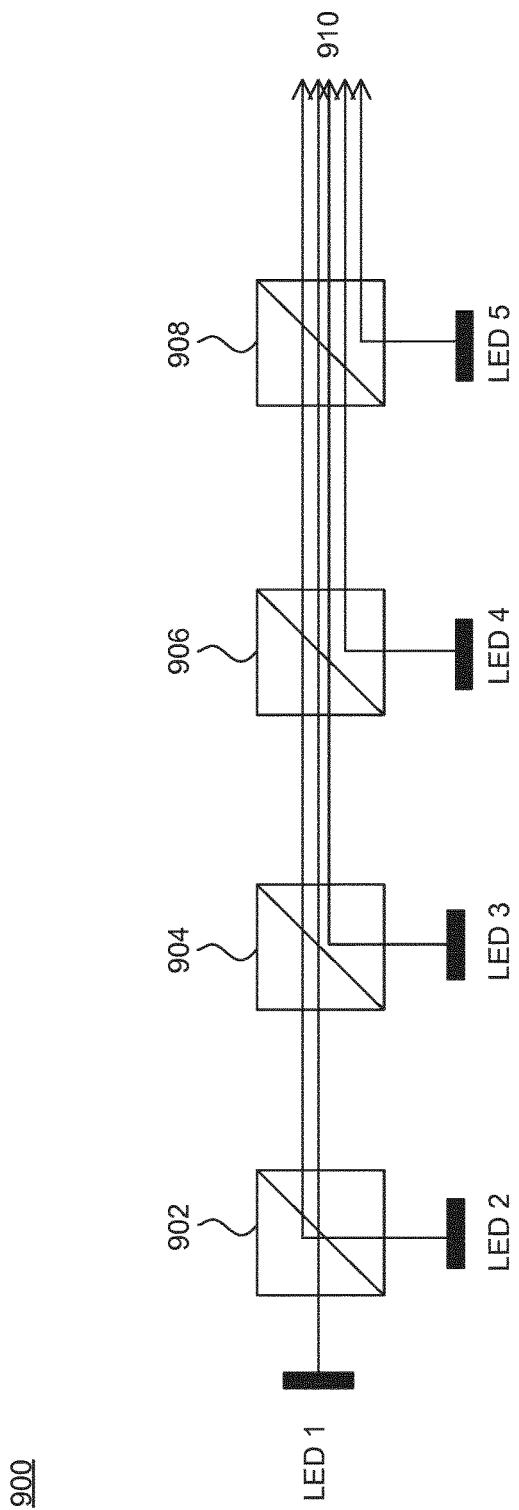
FIG. 9 is a schematic illustration of another light combiner, according to an embodiment.

FIG. 9 illustrates another example of a light combiner 900 that may be used to combine the output of a plurality of light sources, according to an embodiment. Light combiner 900 may be one of several components within radiation source 402. Light combiner 900 includes a series of filters (e.g., 902, 904, 906, and 908). The filters each act like beam splitters that reflect only certain wavelengths, while allowing other wavelengths to pass through.

The example light sources (LED 1 . . . LED 5) of light combiner 900 are similar to those described above in light combiner 500 and will not be described again here. Additionally, each filter 902, 904, 906, and 908 are similar to the filters described in light combiner 500 in that both types of filters include a layered stack of thin films that is designed to reflect a certain wavelength range while passing other wavelengths. However, in contrast with the filters of light combiner 500, filters 902, 904, 906, and 908 of light combiner 900 are designed to utilize light transmission more than light reflection to generate final output beam 910.

According to an embodiment, filter 902 is designed to substantially transmit the light generated by LED 1 while substantially reflecting the light generated by LED 2. Filter 904 is designed to substantially transmit the light generated by both LED 1 and LED 2 while substantially reflecting the light generated by LED 3. Filter 906 is designed to substantially transmit the light generated by LED 1, LED 2, and LED 3 while substantially reflecting the light generated by LED 4. Filter 908 is designed to substantially transmit the light generated by LED 1, LED 2, LED 3, and LED 4 while substantially reflecting the light generated by LED 5.

The placement of each of filters 902-908 is not limited to the illustration in FIG. 9. Additionally, there may be other optical components placed before, after, or between any of filters 902-908 for collimating, focusing, and/or directing the light without deviating from the scope or spirit of the embodiments described herein. Additional filters may be added to light combiner 900 without the need to adjust or replace the existing filters.

As discussed previously with regards to light combiner 500, light is incident upon a surface of a given filter at an incidence angle less than 45 degrees or less than 30 degrees, according to an embodiment. The Incidence angle may be between 10 degrees and 25 degrees. The incidence angle may be around 15 degrees. Using a smaller incidence angle may help to reduce or eliminate polarization splitting from occurring, and thus maximize the amount of light that is being reflected. In one embodiment, each of filters 902, 904, 906, and 908 are arranged such that the incidence angle is the same for each filter.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A light combiner, comprising:
   a plurality of light sources;
   a first filter configured to reflect over 50% of the light generated from a first source of the plurality of light sources, and to transmit over 50% of the light generated from a second source of the plurality of light sources; and
   a second filter configured to reflect over 50% of the light generated from the first source and the second source of the plurality of light sources, and to transmit over 50% of the light generated from a third source of the plurality of light sources,
   wherein an angle of incidence of the light generated from the first source on a surface of the first filter is less than 30 degrees.

2. The light combiner of claim 1, further comprising a third filter configured to reflect over 50% of the light generated from the first source, the second source, and the third source of the plurality of light sources, and to transmit over 50% of the light generated from a fourth source of the plurality of light sources.

3. The light combiner of claim 2, further comprising a fourth filter configured to reflect over 50% of the light generated from the first source, the second source, the third source, and the fourth source of the plurality of light sources, and to transmit over 50% of the light generated from a fifth source of the plurality of light sources.

4. The light combiner of claim 3, wherein each of the first source, second source, third source, fourth source, and fifth source have different center wavelengths.

5. The light combiner of claim 1, wherein each of the first filter and the second filter comprise a layered stack of thin film materials.

6. The light combiner of claim 5, wherein the layered stack of thin film materials includes silicon dioxide and hafnium oxide.

7. The light combiner of claim 6, wherein silicon dioxide thin films alternate with hafnium oxide thin films in the layered stack.

8. The light combiner of claim 6, wherein a thickness of each thin film in the layered stack of thin film materials is between 5 nm and 65 nm.

9. The light combiner of claim 1, wherein the plurality of sources comprise ultraviolet light emitting diodes (LEDs).

10. A metrology system, comprising:
    a radiation source configured to generate light;
    a projection grating configured to receive the light and project an image towards a substrate;
    a detection grating configured to receive the image reflected off a surface of the substrate; and
    a detector configured to receive the image from the detection grating and measure a height of the surface of the substrate based on the received image,
    wherein the radiation source comprises:
       a plurality of light sources,
       a first filter configured to reflect over 50% of the light generated from a first source of the plurality of light sources, and to transmit over 50% of the light generated from a second source of the plurality of light sources, and
       a second filter configured to reflect over 50% of the light generated from the first source and the second source of the plurality of light sources, and to transmit over 50% of the light generated from a third source of the plurality of light sources,
       wherein an angle of incidence of the light generated from the first source on a surface of the first filter is less than 30 degrees.

11. The metrology system of claim 10, wherein the plurality of light sources comprise ultraviolet LEDs.

12. The metrology system of claim 10, wherein the radiation source further comprises a third filter configured to reflect over 50% of the light generated from the first source, the second source, and the third source of the plurality of light sources, and to transmit over 50% of the light generated from a fourth source of the plurality of light sources.

13. The metrology system of claim 12, wherein the radiation source further comprises a fourth filter configured to reflect over 50% of the light generated from the first source, the second source, the third source, and the fourth source of the plurality of light sources, and to transmit over 50% of the light generated from a fifth source of the plurality of light sources.

14. The metrology system of claim 10, wherein each of the first filter and the second filter comprise a layered stack of thin film materials that includes silicon dioxide and hafnium oxide.

15. The metrology system of claim 10, wherein each of the sources has a different center wavelength.

16. A lithographic apparatus, comprising:
    an illumination system configured to illuminate a pattern of a patterning device;
    a projection system configured to project an image of the pattern onto a target portion of a substrate; and
    a metrology system configured to determine a height of a surface of the substrate,
    wherein a radiation source of the metrology system comprises:
       a plurality of light sources,
       a first filter configured to reflect over 50% of the light generated from a first source of the plurality of light sources, and to transmit over 50% of the light generated from a second source of the plurality of light sources, and
       a second filter configured to reflect over 50% of the light generated from the first source and the second source of the plurality of light sources, and to transmit over 50% of the light generated from a third source of the plurality of light sources,
       wherein an angle of incidence of the light generated from the first source on a surface of the first filter is less than 30 degrees.

17. The lithographic apparatus of claim 16, wherein the radiation source further comprises a third filter configured to reflect over 50% of the light generated from the first source, the second source, and the third source of the plurality of light sources, and to transmit over 50% of the light generated from a fourth source of the plurality of light sources.

18. The lithographic apparatus of claim 17, wherein the radiation source further comprises a fourth filter configured to reflect over 50% of the light generated from the first source, the second source, the third source, and the fourth source of the plurality of light sources, and to transmit over 50% of the light generated from a fifth source of the plurality of light sources.

19. The lithographic apparatus of claim 16, wherein each of the first filter and the second filter comprise a layered stack of thin film materials that includes silicon dioxide and hafnium oxide.

20. The lithographic apparatus of claim 16, wherein the plurality of light sources comprise ultraviolet LEDs.

* * * * *